United States Patent
Kawasaki et al.

(10) Patent No.: US 7,691,655 B2
(45) Date of Patent: Apr. 6, 2010

(54) METHOD OF MANUFACTURING SEMICONDUCTOR OPTICAL DEVICE

(75) Inventors: Kazushige Kawasaki, Tokyo (JP); Kimio Shigihara, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 8 days.

(21) Appl. No.: 11/555,703

(22) Filed: Nov. 2, 2006

(65) Prior Publication Data

US 2007/0071051 A1 Mar. 29, 2007

Related U.S. Application Data

(62) Division of application No. 10/803,956, filed on Mar. 19, 2004, now abandoned.

(30) Foreign Application Priority Data

Apr. 15, 2003 (JP) .............................. 2003-109960

(51) Int. Cl.
*H01L 21/00* (2006.01)
(52) U.S. Cl. .............................. 438/40; 438/43; 438/47; 438/502; 438/509; 438/16; 257/E21.53
(58) Field of Classification Search .................. 438/37, 438/39, 509, 16, 40, 42, 43, 47, 502; 257/E21.521, 257/E21.53
See application file for complete search history.

(56) References Cited

U.S. PATENT DOCUMENTS 6,150,677 A 11/2000 Tanaka et al.
6,670,202 B2 * 12/2003 Watanabe ................. 438/20
6,876,002 B2 * 4/2005 Matsumoto et al. ......... 257/79
2002/0072142 A1 6/2002 Ooi et al.
2002/0075923 A1 6/2002 Tashiro et al.
2003/0128730 A1 * 7/2003 Ohkubo ..................... 372/46

FOREIGN PATENT DOCUMENTS

| JP | 11-274083 A | 10/1999 |
|---|---|---|
| JP | 2001-257430 A | 9/2001 |
| JP | 2002-319548 A | 10/2002 |

OTHER PUBLICATIONS

G. Beister et al., "Monomode emission at 350mW and high reliability with InGaAs/AlGaAs($\lambda$=1020nm) ridge waveguide laser diodes", Electronics Letters, Apr. 16, 1998, vol. 34, No. 8, pp. 778-779.
Toshiaki Fukunaga at al., "Reliable operation of strain-compensated 1.06 $\mu$m InGaAs/InGaAsP/GaAs single quantum well lasers", Appl. Phys. Lett. 69 (2), Jul. 8, 1996, pp. 248-250.

* cited by examiner

*Primary Examiner*—Julio J Maldonado
(74) *Attorney, Agent, or Firm*—Leydig, Voit & Mayer, Ltd.

(57) ABSTRACT

Method for manufacturing a semiconductor optical device includes forming an epitaxial structure containing at least an active layer which can emit light, of a III-V group semiconductor material; forming an insulating layer over the epitaxial structure, which prevents the V group element from escaping from the epitaxial structure during heat treatment; heat treating the epitaxial structure at at least 800 degrees C.; and removing the insulating layer, thereby enhancing the reliability of the device.

6 Claims, 4 Drawing Sheets

METHOD OF MANUFACTURING SEMICONDUCTOR OPTICAL DEVICE

BACKGROUND OF THE INVENTION

1. Field of the Invention

The present invention relates to a semiconductor optical device and method for manufacturing the same, which can be used for optical information processing and optical communication and the like, suitably for a pumping light source for a fiber amplifier.

2. Description of the Related Art

A light source for optical information processing and optical communication is required to have high power output and high reliability, particularly in case of a pumping light source for a fiber amplifier which can be used for an optical repeater in a submarine optical cable, a semiconductor optical device is required to have a long lifetime and high reliability.

As the pumping light source for a fiber amplifier, the semiconductor optical device having an emission wavelength of 0.98 μm or 1.02 μm is generally selected and a strained quantum well structure is adopted for an active layer thereof. For example, there is a distortion of about 1% between an InGaAs quantum well layer and a GaAs guide layer.

For main degradation causes of the semiconductor optical device, end face degradation due to optical absorption on an optical exit face and internal degradation due to dislocation in a crystal or distortion between epitaxial growth layers are known.

To counter the end face degradation, a window structure in which the band gap energy of the optical exit face is larger than that of the active layer can be adopted to prevent the optical absorption or an appropriate coating on the end face can be designed.

To counter the internal degradation, a substrate having a low dislocation density can be used or an active layer with a strain-compensated structure can be adopted.

The related prior arts are listed as follows:

[Document 1]

G. Beister et al., "Monomode emission at 350 mW and high reliability with InGaAs/AlGaAs (λ=1020 nm) ridge waveguide laser diodes", ELECTRONICS LETTERS, 16 Apr. 1998, Vol. 34, No. 8, pp. 778-779

[Document 2]

Toshiaki Fukunaga et al., "Reliable operation of strain-compensated 1.06 μm InGaAs/InGaAsP/GaAs single quantum well lasers", Appl. Phys. Lett., Vol. 69(2), 8 Jul. 1996, pp. 248-250

In FIG. 2 of the above-mentioned document 1, the result of a reliability examination of the semiconductor optical device of 1.02 μm wavelength band is illustrated using graphs. The examination conditions are atmosphere at 40 degree-C., a constant output of 300 mW and a measurement size of ten. The horizontal axis shows an aging time by 1,000 hours, and the vertical axis shows a driving current (mA).

These graphs show initial degradation for three of ten samples in which the driving current rapidly increases in an initial stage. For the remaining seven samples, the driving current gradually increases with time progress and a degradation rate is calculated by linear approximation with 1.5× $10^{-5}$ to 8.6×$10^{-5}$ (/h), resulting in 1.5% to 8.6% of increase in current at 1,000 hours.

In FIG. 6 of the above-mentioned document 2, the result of a reliability examination of the semiconductor optical device of 1.06 μm wavelength band is illustrated using graphs. The examination conditions are atmosphere at 25 degree-C., a constant output of 250 mW and a measurement size of both ten of SC-SQW (strain-compensated single quantum well) lasers and ten of SL-SQW (superlattice single quantum well) lasers. The horizontal axis shows an aging time by 1,000 hours, and the vertical axis shows a driving current (mA).

These graphs show that all of the SL-SQW lasers are degraded before 1,000 hours, on the other hand, all of the SC-SQW lasers are not remarkably degraded because the driving current does not increase even at 1,000 hours.

SUMMARY OF THE INVENTION

The purpose of the present invention is to provide a semiconductor optical device and method for manufacturing the same which can remarkably enhance the reliability of devices.

A method for manufacturing a semiconductor optical device according to the present invention includes:

step for forming an epitaxial growth layer containing at least an active layer which can emit light, using a III-V group semiconductor material;

step for forming an insulation layer over the epitaxial growth layer, which can prevent the V group element from escaping during heat treatment;

step for applying heat treatment to the epitaxial growth layer at a temperature of 800 degree-C. or more;

step for removing the insulation layer.

Moreover, a semiconductor optical device according to the present invention includes:

an epitaxial growth layer formed of a III-V group semiconductor material, containing at least an active layer which can emit light;

wherein the composition of the epitaxial growth layer is changing continuously near the interface.

Such a semiconductor optical device can attain a significantly longer continuous operation time and extremely higher reliability, as compared to the conventional device.

DETAILED DESCRIPTION OF THE PREFERRED EMBODIMENTS

This application is based on an application No. 2003-109, 960 filed Apr. 15, 2003 in Japan, the disclosure of which is incorporated herein by reference.

Hereinafter, preferred embodiments will be described with reference to drawings.

Embodiment 1

FIGS. 1A to 1C and 2A to 2C are illustrative diagrams showing an example of a manufacturing process of a semiconductor optical device according to the present invention. Here, although an example in which GaAs, AlGaAs and InGaAs are used as III-V group semiconductor materials is explained, binary, ternary or quaternary or more compound semiconductor in combination with III group element(s) such as B, Al, Ga, In and Tl, and V group element(s) such as N, P, As, Sb and Bi may be used in the present invention.

Figure 1A:
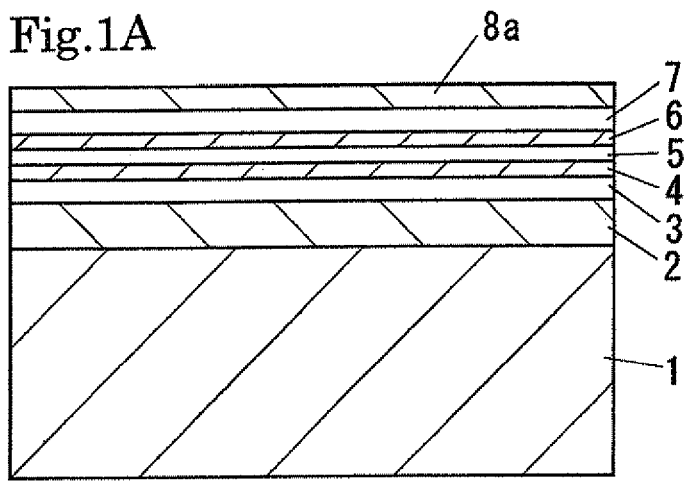
FIGS. 1A to 1C and 2A to 2C are illustrative diagrams showing an example of a manufacturing process of a semiconductor optical device according to the present invention.

As shown in FIG. 1A, on a substrate 1 with low dislocation which is formed of n-type GaAs or the like, an n-type cladding layer 2 formed of $Al_{0.3}Ga_{0.7}As$ or the like, a light guide layer 3 formed of GaAs or the like, a quantum well layer 4 formed of $In_{0.14}Ga_{0.86}As$ or the like, a barrier layer 5 formed of GaAs or the like, a quantum well layer 6 formed of $In_{0.14}Ga_{0.86}As$ or the like, a light guide layer 7 formed of GaAs or the like and a p-type cladding layer 8a formed of $Al_{0.3}Ga_{0.7}As$ or the like are epitaxially grown in this sequence using deposition process such as MOCVD (Metal Organic Chemical Vapor Deposition).

For an active layer which can generate light, double quantum well (DQW) structure in which two quantum well layers 4 and 6 are disposed on both sides of the barrier layer 5 is adopted.

The p-type cladding layer 8a is part of a final p-type cladding layer, which has such a thickness as photoluminescence (PL) measurement can be performed at a back step.

Figure 1B:
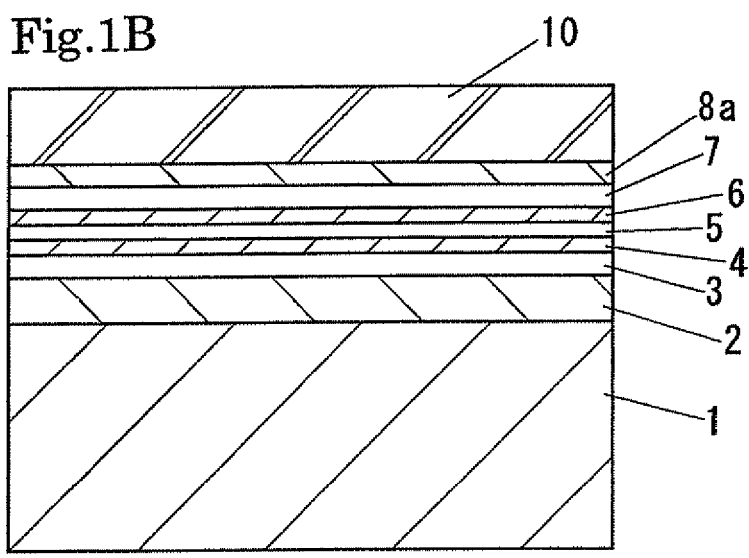

Next, as shown FIG. 1B, on the p-type cladding layer 8a an insulation layer 10 is formed of SiO, SiN, SiON or the like using deposition process such as CVD (Chemical Vapor Deposition) to prevent the V group element (herein As) from escaping during heat treatment at a back step.

Next, heat treatment is applied to the substrate 1 with the layers 2-10 for nearly 30 minutes, for example, in an annealing furnace of quartz tube type with nitrogen ($N_2$) atmosphere at a temperature of 800 degree-C. or more.

After heat treatment, photoluminescence (PL) measurement is performed by irradiating light of an energy higher than the band gap energy of the active layer and then analyzing the emission spectrum from the active layer.

In case the similar PL measurement has been performed before heat treatment, the emission spectrum after heat treatment can be compared with the emission spectrum before heat treatment. If the result of the comparison shows that the PL wavelength (i.e. peak wavelength of the emission spectrum) after heat treatment is blue-shifted and moved toward the short wavelength side, compared to the PL wavelength before heat treatment, the effect of annealing by heat treatment can be checked.

Figure 1C:
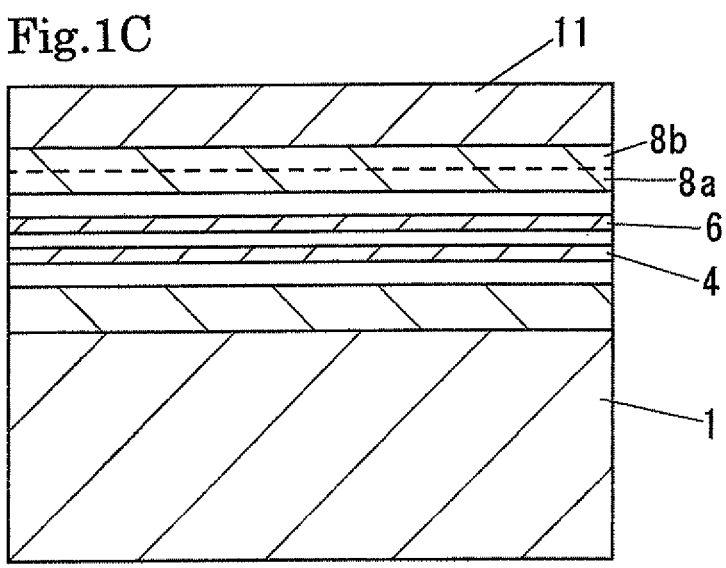

Next, after removing the insulation layer 10 using wet or dry etching, etc., as shown in FIG. 1C, a residual p-type cladding layer 8b formed of $Al_{0.3}Ga_{0.7}As$ or the like and a contact layer 11 formed of GaAs or the like are epitaxially grown using MOCVD.

Figure 2A:
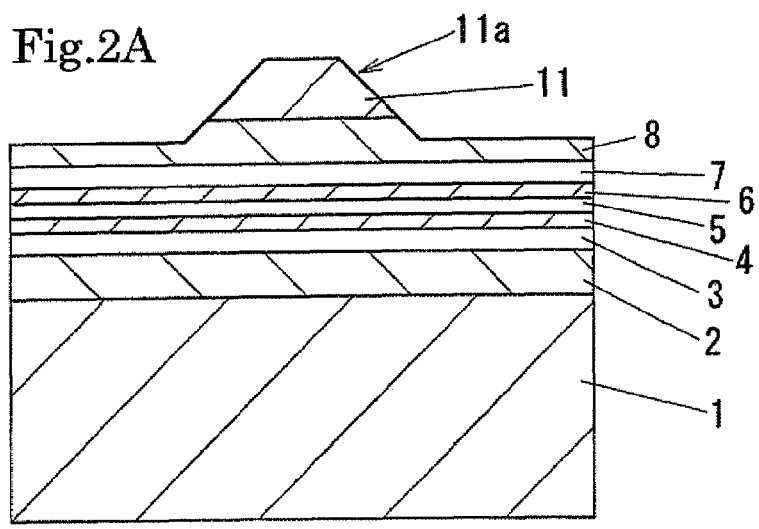

Next, after forming a mask pattern for ridge on the contact layer 11 using a photoresist and an insulating film, as shown in FIG. 2A, a ridge 11a is formed by removing portions of the contact layer 11 and the p-type cladding layer 8 using wet or dry etching, etc. Then, the mask pattern for ridge is removed.

Figure 2B:
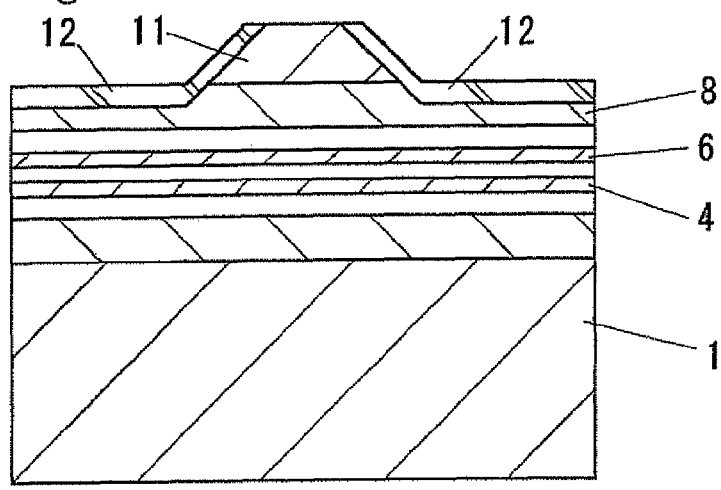

Next, as shown in FIG. 2B, an insulation layer 12 is formed of SiO, SiN, SiON or the like using CVD except the top of the ridge 11a.

Figure 2C:
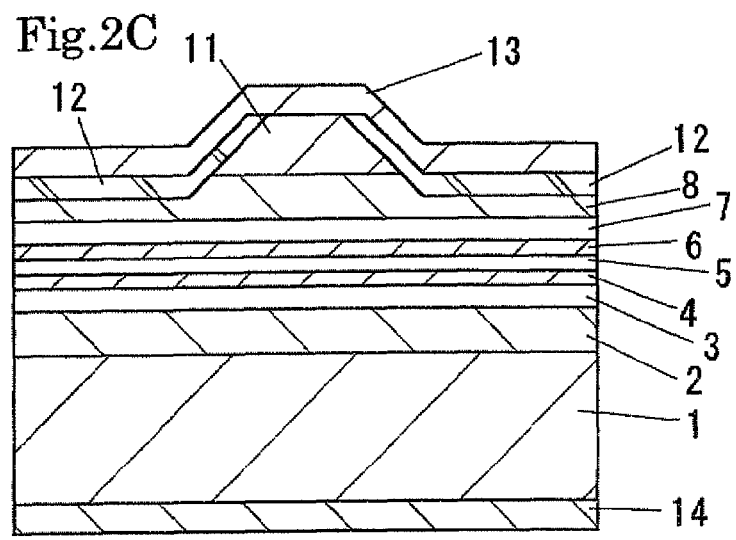

Next, as shown in FIG. 2C, a p-side electrode 13 is formed over the insulation layer 12 using spattering, etc. Next, after scraping the undersurface of the substrate 1 so thinly as to perform chip cleavage easily, an n-side electrode 14 is formed over the undersurface of the substrate 1 using spattering, etc. Then, the substrate 1 is divided into chips by cleavage.

The semiconductor optical device obtained in this way has the composition of the epitaxial growth layer which is changing continuously near interfaces, since heat treatment has been performed at a temperature of 800 degree-C. or more. Consequently, distortion between the epitaxial growth layers is eased, thereby remarkably enhancing the reliability of the device.

Figure 3:
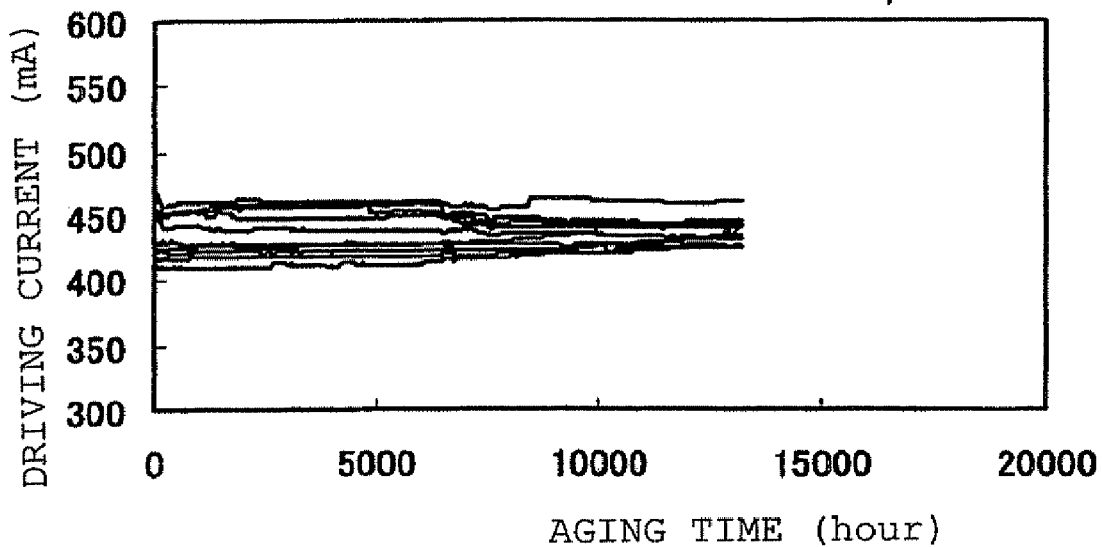
FIG. 3 is a graph showing an example of the reliability examination result of the semiconductor optical device to which heat treatment has been applied.

FIG. 3 is a graph showing an example of the reliability examination result of the semiconductor optical device to which heat treatment has been applied. The semiconductor optical devices which have been annealed for 30 minutes in nitrogen atmosphere at a temperature of 820 degree-C. in the heat treatment of FIG. 1B are evaluated by measuring change of the driving current with time progress using an APC (Automatic Power Control) circuit which can maintain a constant light output. The examination conditions are atmosphere at 50 degree-C., a constant output of 300 mW and a measurement size of ten.

This graph shows that the driving currents of all ten of samples do not increase even after 13,000 hours and conspicuous degradation is not seen. As a result, the semiconductor optical devices can be continuously operated for 10,000 hours or more and can be realized with extremely high reliability.

In addition, the result of PL measurements before and after the annealing process for 30 minutes at a temperature of 820 degree-C. shows that the PL wavelength before the annealing process is 1,010 nm and PL wavelength after the annealing process is 974 nm with blueshift of 45 meV in terms of photon energy. This fact proves that distortion between the epitaxial growth layers is eased due to heat treatment and the band gap energy of the active layer is increased.

Next, structure analysis of the epitaxial growth layer using SIMS (Secondary Ion Mass Spectroscopy) will be described.

Figure 4:
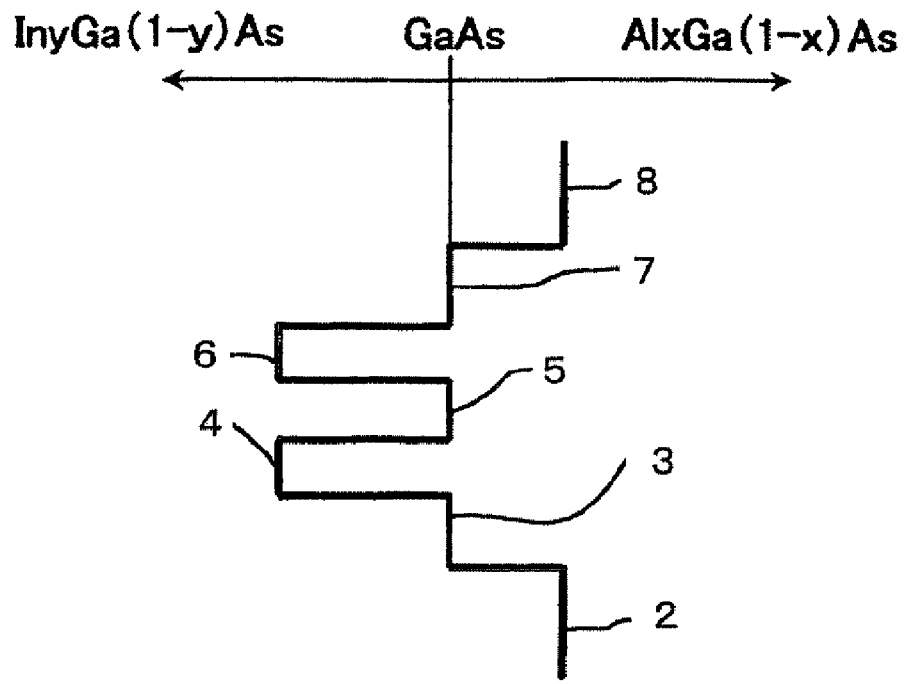
FIG. 4 is a band diagram of the epitaxial growth layer before heat treatment.
Figure 5:
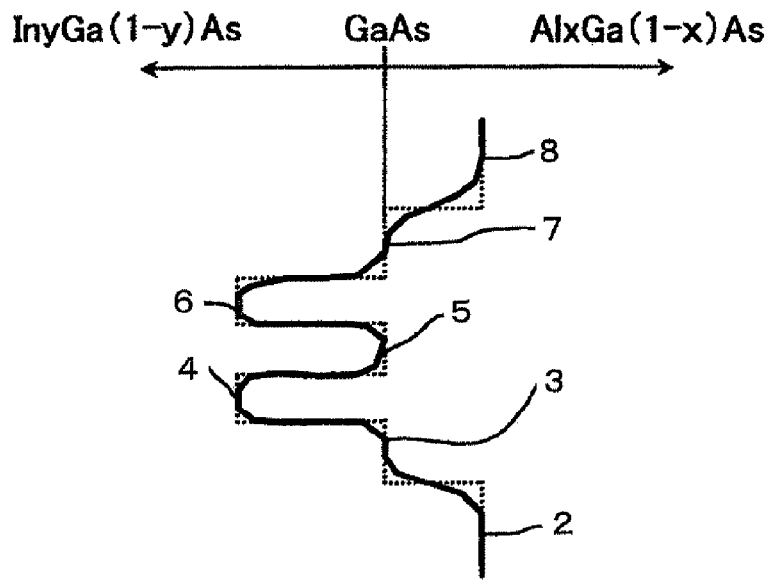
FIG. 5 is a band diagram of the epitaxial growth layer after heat treatment.

FIG. 4 is a band diagram of the epitaxial growth layer before heat treatment. FIG. 5 is a band diagram of the epitaxial growth layer after heat treatment. The Vertical axis shows the position of thickness direction and the horizontal axis shows In composition y leftward and Al composition x rightward with the center of GaAs.

The n-type cladding layer 2, the light guide layer 3, the quantum well layer 4, the barrier layer 5, the quantum well layer 6, the light guide layer 7 and the p-type cladding layer 8a are deposited in sequence from the bottom, and it can be seen that the composition of each layer is changed stepwise near the interface before heat treatment as shown FIG. 4.

After heat treatment as shown FIG. 5, on the other hand, it can be seen that the composition of each layer is continuously changed near the interface and the steepness of the epitaxial growth interface is reduced. This fact proves that distortion which may cause degradation of the device is eased.

Figure 6:
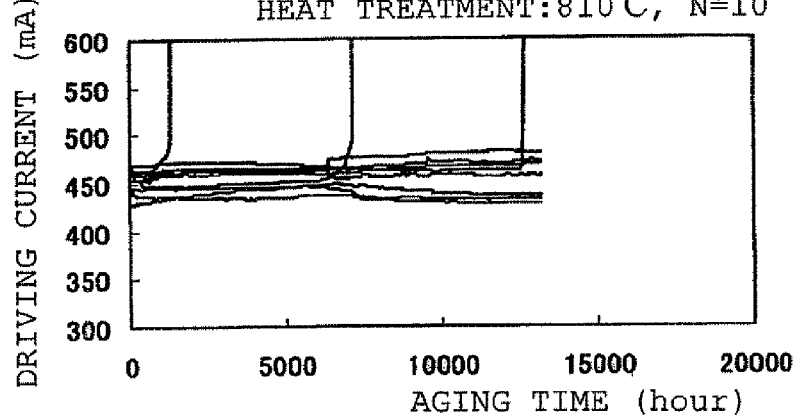
FIG. 6 is a graph showing an example of the reliability examination result of the semiconductor optical device subject to another condition of heat treatment.

FIG. 6 is a graph showing an example of the reliability examination result of the semiconductor optical device subject to another condition of heat treatment. Here, the other semiconductor optical devices which have been annealed for 30 minutes in nitrogen atmosphere at a temperature of 810 degree-C. in the heat treatment of FIG. 1B are evaluated under an APC operation as in FIG. 3. The examination conditions are atmosphere at 50 degree-C., a constant output of 300 mW and a measurement size of ten.

This graph shows that one sample is degraded about 1,200 hours, another sample is degraded about 7,000 hours and the other is degraded about 12,000 hours while the remaining samples are not remarkably degraded since the driving current does not increase at 13,000 hours.

Furthermore, the PL wavelength before and after heat treatment is changed from 1,010 nm to 984 nm with blueshift of 32 meV in terms of photon energy.

Figure 7:
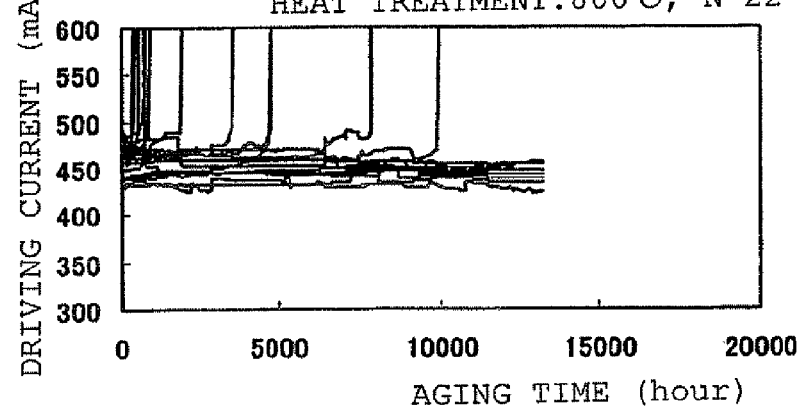
FIG. 7 is a graph showing an example of the reliability examination result of the semiconductor optical device subject to yet another condition of heat treatment.

FIG. 7 is a graph showing an example of the reliability examination result of the semiconductor optical device subject to yet another condition of heat treatment. Here, the still other semiconductor optical devices which have been annealed for 30 minutes in nitrogen atmosphere at a temperature of 800 degree-C. in the heat treatment of FIG. 1B are evaluated under an APC operation as in FIG. 3. The examination conditions are atmosphere at 50 degree-C., a constant output of 300 mW and a measurement size of twenty two.

This graph shows that twelve sample are degraded by 13,000 hours while the remaining ten of samples are not remarkably degraded since the driving current does not increase at 13,000 hours.

Furthermore, the PL wavelength before and after heat treatment is changed from 1,010 nm to 993 nm with blueshift of 21 meV in terms of photon energy.

In this way, applying heat treatment at a temperature of 800 degree-C. or more to the epitaxial growth layers enables the semiconductor optical device to attain a longer continuous operation time and extremely higher reliability than that of the conventional device.

Moreover, the insulation layer formed over the epitaxial growth layers can prevent the V group element from escaping during heat treatment, thereby suppressing variations of the layer composition.

Furthermore, performing heat treatment so that the PL wavelength is blue-shifted preferably by 20 meV or more can weaken the steepness of the epitaxial growth interface, resulting in the distortion relief effect which can attain high reliability.

In addition, the PL measurement after heat treatment, preferably both before and after heat treatment, enables in-line evaluation during manufacturing process, thereby improving the manufacture yield of the semiconductor optical devices.

The above description exemplifies that the p-type cladding layer 8 is deposited by two separate steps and heat treatment is performed between the steps. However, heat treatment may be performed during forming another layer, or heat treatment may be performed after depositing all the layers by onetime epitaxial growth, resulting in the similar distortion relief effect Although the present invention has been fully described in connection with the preferred embodiments thereof and the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method of manufacturing a semiconductor optical device comprising:
   growing an epitaxial structure including a first cladding layer of a first conductivity type, an active layer, and a second cladding layer of a second conductivity type, opposite the first conductivity type, wherein the active layer, which can emit light from a light-emitting region of the active layer, is a III-V semiconductor material including a group V element;
   forming an insulating layer, which can prevent the group V element from escaping from the active layer during a heat treatment, on the second cladding layer;
   before heat treatment, irradiating the epitaxial structure with light having higher energy than the energy bandgap of the active layer and measuring peak wavelength of photoluminescence radiated by the light-emitting region of the active layer of the epitaxial structure;
   heat treating the epitaxial structure at a temperature of at least 800 degrees C.;
   after the heat treatment, irradiating the epitaxial structure with light having higher energy than the energy bandgap of the active layer and measuring peak wavelength of photoluminescence radiated by the light-emitting region of the active layer of the epitaxial structure;
   comparing the peak wavelength measured after the heat treatment to the peak wavelength measured before the heat treatment to determine whether the peak wavelength after the heat treatment is shorter than the peak wavelength before the heat treatment;
   removing the insulating layer; and
   after removing the insulating layer, growing a third cladding layer of the second conductivity type on the second cladding layer, growing a contact layer on the third cladding layer, forming an etching mask on the contact layer, and removing parts of the contact layer and the second and third cladding layers to form a ridge.

2. The method of manufacturing a semiconductor optical device according to claim 1 comprising growing, as the active layer, a double quantum well structure including two quantum well layers sandwiching a barrier layer.

3. The method of manufacturing a semiconductor optical device according to claim 1 including determining whether the difference between the peak wavelength after the heat treatment has become shorter than the peak wavelength before the heat treatment by at least 20 meV, in terms of energy.

4. A method of manufacturing a semiconductor optical device comprising:
   growing an epitaxial structure including a first cladding layer of a first conductivity type, an active layer, which can emit light, of III-V semiconductor material including a group V element, and a second cladding layer of a second conductivity type, opposite the first conductivity type;
   forming an insulating layer, which can prevent the group V element from escaping from the active layer during a heat treatment, on the second cladding layer;
   before heat treatment, irradiating the epitaxial structure with light having higher energy than the energy bandgap of the active layer and measuring peak wavelength of photoluminescence radiated by the epitaxial structure;
   heat treating the epitaxial structure at a temperature of at least 800 degrees C.;
   after the heat treatment, irradiating the epitaxial structure with light having higher energy than the energy bandgap of the active layer and measuring peak wavelength of photoluminescence radiated by the epitaxial structure;
   comparing the peak wavelength measured after the heat treatment to the peak wavelength measured before the heat treatment to determine whether the peak wavelength after the heat treatment is shorter than the peak wavelength before the heat treatment;
   removing the insulating layer from and exposing the second cladding layer;
   growing a third cladding layer of the second conductivity type on the second cladding; and
   after growing a third cladding layer, growing a contact layer on the third cladding layer, forming an etching mask on the contact layer, and removing parts of the contact layer and the second and third cladding layers to form a ridge.

5. The method of manufacturing a semiconductor optical device according to claim 4 comprising growing, as the active layer, a double quantum well structure including two quantum well layers sandwiching a barrier layer.

6. The method of manufacturing a semiconductor optical device according to claim 4 including determining whether the difference between the peak wavelength after the heat treatment has become shorter than the peak wavelength before the heat treatment by at least 20 meV, in terms of energy.

* * * * *